United States Patent
Yoshiike et al.

(10) Patent No.: US 6,809,406 B2
(45) Date of Patent: Oct. 26, 2004

(54) COF TAPE CARRIER, SEMICONDUCTOR ELEMENT, COF SEMICONDUCTOR DEVICE, AND METHOD FOR MANUFACTURING OF COF SEMICONDUCTOR DEVICE

(75) Inventors: Kazuaki Yoshiike, Tokyo (JP); Shuichi Yamanaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/452,297

(22) Filed: Jun. 3, 2003

(65) Prior Publication Data

US 2004/0070057 A1 Apr. 15, 2004

(30) Foreign Application Priority Data

Sep. 30, 2002 (JP) ........................................ 2002-285730

(51) Int. Cl.[7] ............................................ H01L 23/495
(52) U.S. Cl. ......................... 257/668; 257/701; 257/680
(58) Field of Search ................................ 257/668, 701, 257/671, 673, 675, 680

(56) References Cited

U.S. PATENT DOCUMENTS 6,509,630 B1 * 1/2003 Yanagisawa ................ 257/668

FOREIGN PATENT DOCUMENTS

| JP | 3-56136 | 5/1991 |
|---|---|---|
| JP | 04137630 | 5/1992 |
| JP | 04258126 | 9/1992 |
| JP | 05182971 | 7/1993 |
| JP | 08031885 | 2/1996 |
| JP | 08-335593 | 12/1996 |
| JP | 10107068 | 4/1998 |
| JP | 10321667 | 12/1998 |
| JP | 2000124255 | 4/2000 |
| JP | 2000353716 | 12/2000 |
| JP | 2001144146 | 5/2001 |
| JP | 2001-358165 | 12/2001 |
| JP | 2001-358170 | 12/2001 |
| JP | 2002-124526 | 4/2002 |
| JP | 2002-158309 | 5/2002 |
| JP | 2002261116 | 9/2002 |
| JP | 2003068804 | 3/2003 |

* cited by examiner

*Primary Examiner*—Roy Potter
(74) *Attorney, Agent, or Firm*—Volentine Francos, PLLC

(57) ABSTRACT

A COF tape carrier includes a resist formed on the COF tape carrier. The resist has portions that define a resist opening within the resist so that a semiconductor element is mounted on the COF tape carrier in alignment with the resist opening. The COF tape carrier also includes ridges and valleys formed within the resist opening, the ridges and valleys extending in directions oblique to a perimeter of the resist opening. Inner leads are provided in the resist opening and have portions that extend in a direction oblique to the perimeter. The semiconductor element may include a surface, and ridges and valleys. The surface has perimeters that define the surface. The ridges and valleys are formed on said surface, each of the ridges and valleys extending in directions oblique to the perimeters.

21 Claims, 25 Drawing Sheets

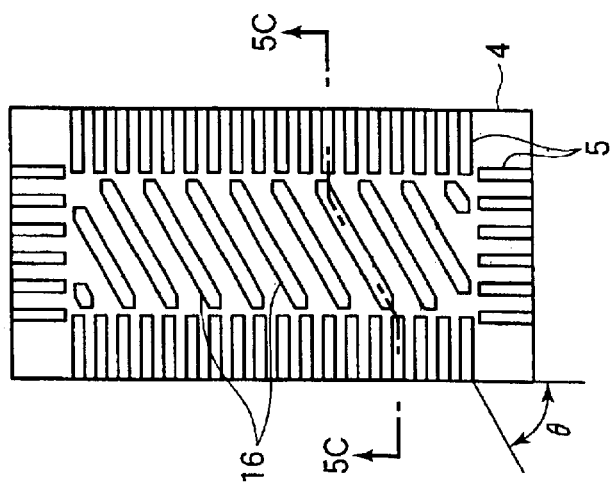
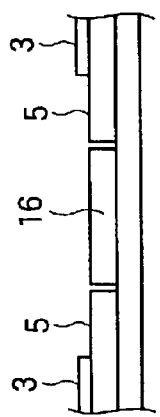
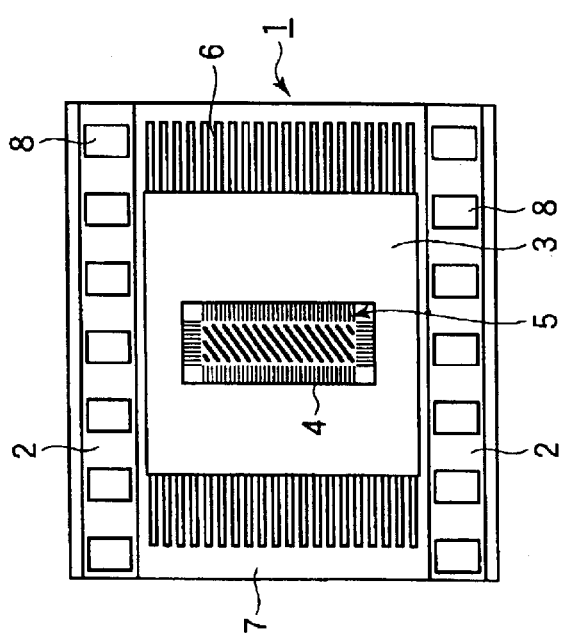
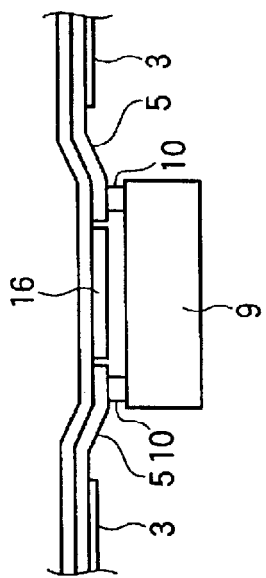

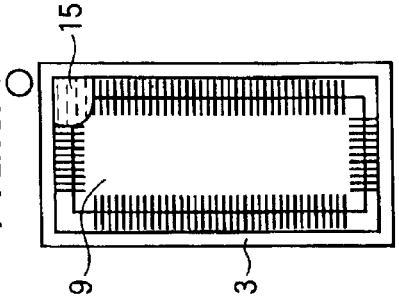
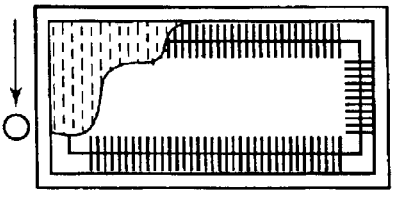
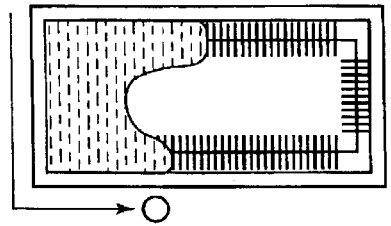
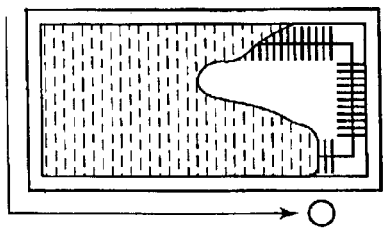
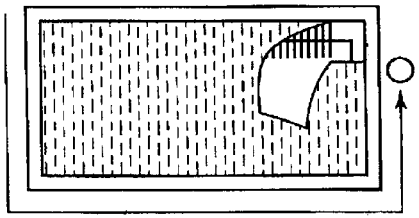
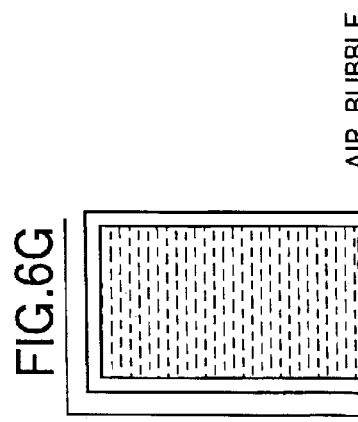

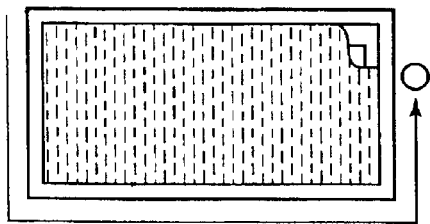
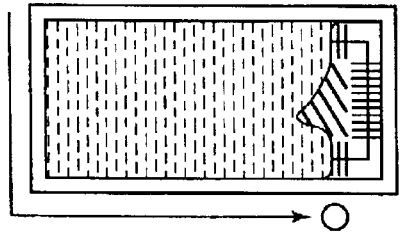
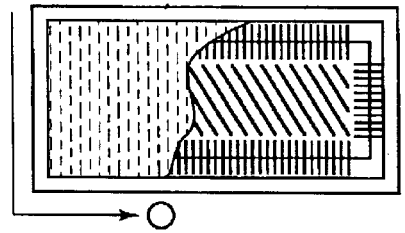
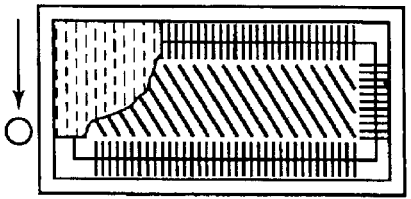
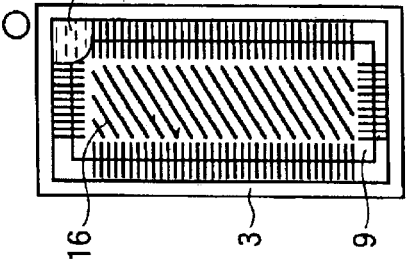
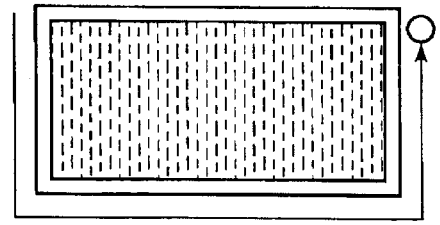
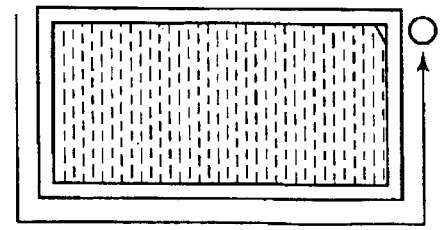

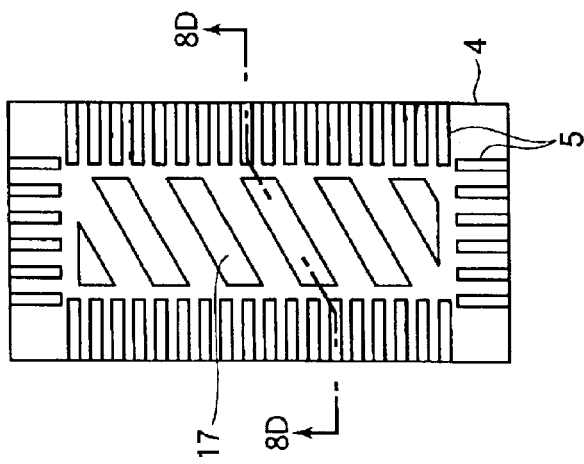
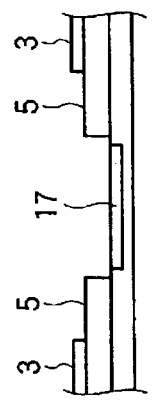
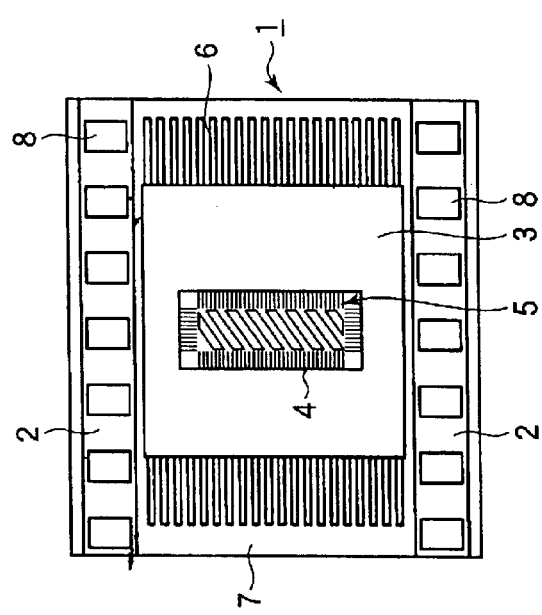
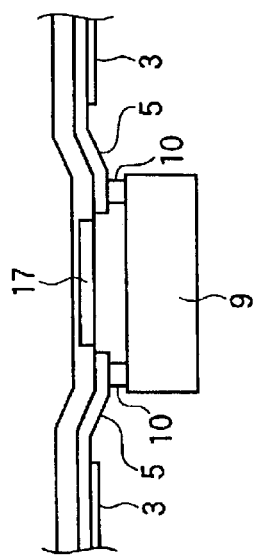

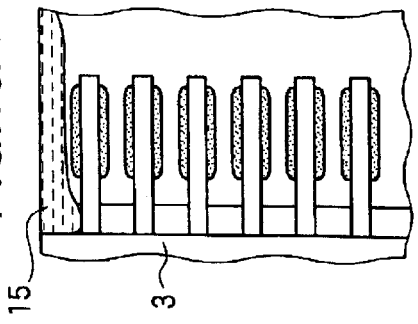
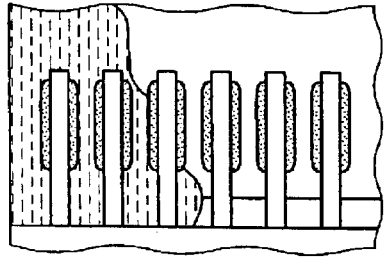
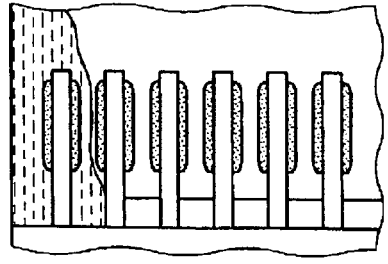
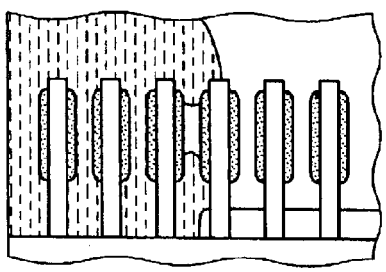
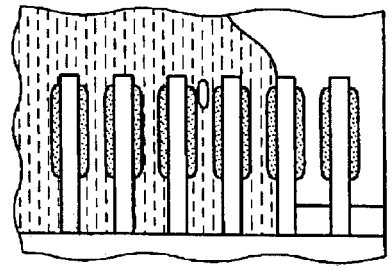
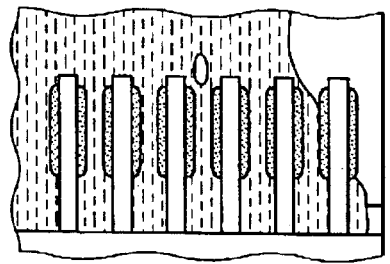
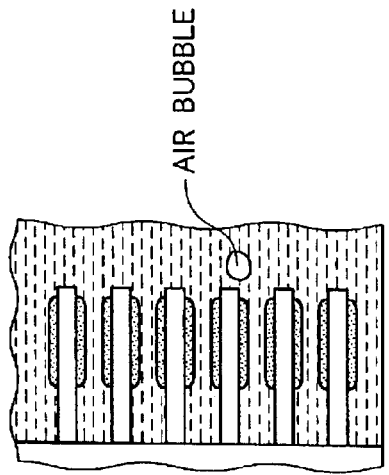

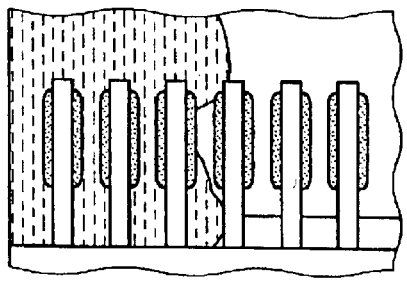
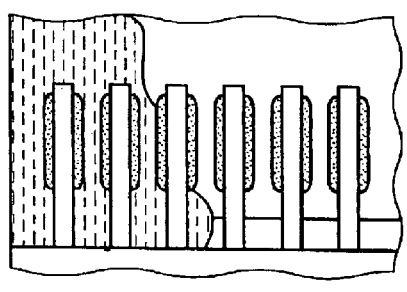
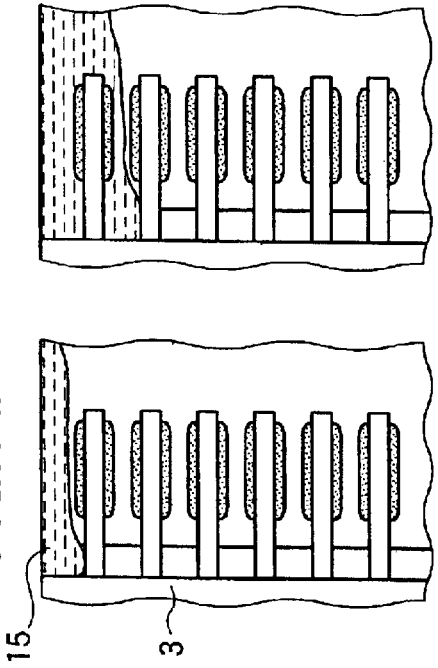
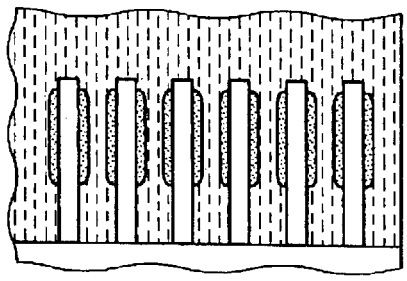
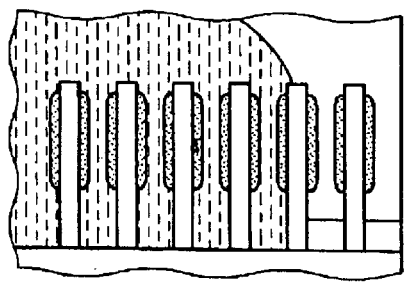

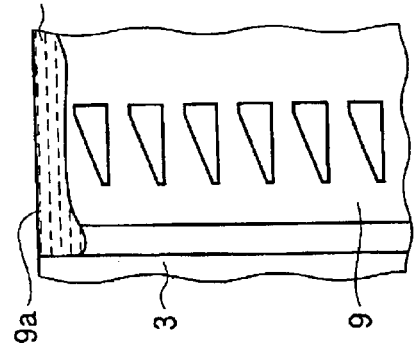
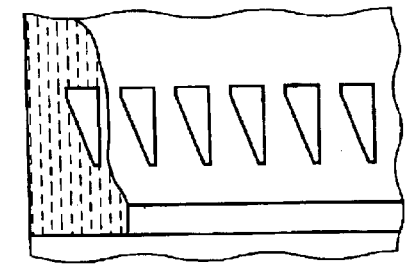
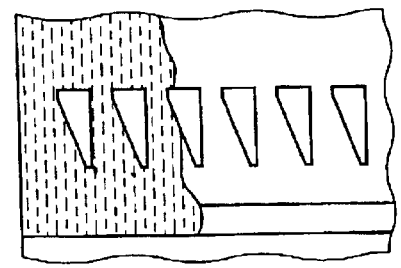
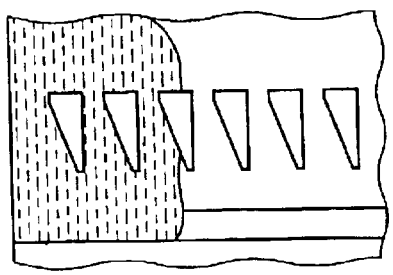
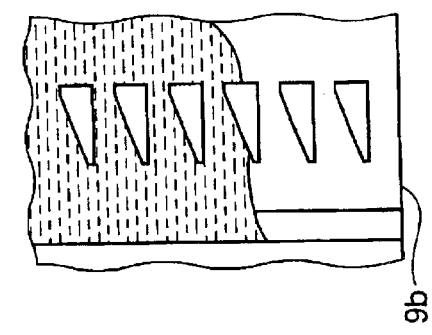
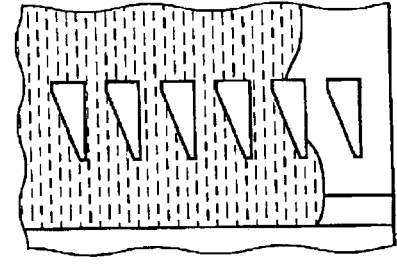
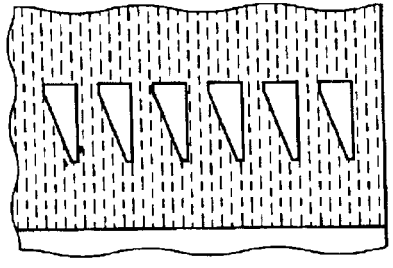

COF TAPE CARRIER, SEMICONDUCTOR ELEMENT, COF SEMICONDUCTOR DEVICE, AND METHOD FOR MANUFACTURING OF COF SEMICONDUCTOR DEVICE

BACKGROUND OF THE INVENTION

1. Field of the Invention

The present invention relates to a COF (Chip-on-Film) semiconductor device and a method for manufacturing such a semiconductor device.

2. Description of the Related Art

A COF semiconductor device is a device in which a semiconductor chip is bonded to a COF tape carrier. The semiconductor chip is positioned in alignment with an opening in a resist formed on the COF tape carrier and the gap between the COF tape carrier and the semiconductor chip is filled with a resin material for sealing.

In order to control the flow of a sealing resin material, conventional COF semiconductor devices are generally designed with the following features.

(1) Dummy patterns are formed on the COF tape carrier as disclosed in Japanese Patent Publications (KOKAI) No. 08-335593 and No. 2002-124526; and (2) Bumps for a semiconductor chip are formed in special shapes as disclosed in Japanese Patent Publication (KOKAI) No. 2001-35165.

However, with the aforementioned conventional COF semiconductor devices, the sealing material ejected around the sides of a semiconductor chip spreads along the sides more rapidly than the sealing material that spreads into a gap between the COF tape carrier and the semiconductor chip during the sealing process. Thus, the air can be trapped between the semiconductor chip and an opening of the resist formed on the tape base material. The resin material also spreads into gaps between bumps provided on the electrodes of the semiconductor chip, thereby trapping the air in the gaps between the bumps. The air trapped in the gaps between the semiconductor chip and the tape base results in air bubbles, leading to cracks in sealed portions and corrosion of sealed portions.

For COF semiconductor devices disclosed in the aforementioned references, the dummy patterns and/or bumps do not appear to have been arranged in an attempt to prevent air bubbles from occurring. Thus, the need exists for optimizing the arrangement or orientation of dummy patterns and/or bumps, thereby eliminating the possibility of air bubbles occurring.

SUMMARY OF THE INVENTION

The present invention was made in view of the problems of the aforementioned conventional art.

An object of the present invention is to provide an optimum structure of a COF semiconductor device that prevents the occurrence of air bubbles and a method for manufacturing such a COF semiconductor device.

A COF tape carrier includes a resist formed on the COF tape carrier. The resist has portions that define a resist opening within the resist so that a semiconductor element is mounted on the COF tape carrier in alignment with the resist opening. The COF tape carrier also includes ridges and valleys formed within the resist opening, the ridges and valleys extending in directions oblique to a perimeter of the resist opening.

A COF tape carrier includes a resist, ridges and valleys, and an inner lead. The resist is formed on the COF tape carrier. The resist has portions that define a resist opening within the resist so that a semiconductor element is mounted on the COF tape carrier in alignment with the resist opening. The ridges and valleys are formed within the resist opening. The ridges and valleys extend in directions oblique to a perimeter of the resist opening. The inner lead is formed in the resist opening and has a first portion that extends in a direction oblique to the perimeter.

A semiconductor element is mountable on a COF tape carrier. The semiconductor element includes a surface, and ridges and valleys. The surface has perimeters that define the surface. The ridges and valleys are formed on the surface, each of the ridges and valleys extending in directions oblique to the perimeters.

A semiconductor element is mountable on a COF tape carrier. The semiconductor element includes a first surface and a line of bumps. The first surface has perimeters and electrode pads formed thereon. Each of the bumps is formed on the electrode pads and has a second surface that opposes an adjacent bump and extends in a plane oblique to the sides.

A method of manufacturing a COF taper carrier type semiconductor apparatus includes the steps of:

positioning a plurality of needles each of which ejects a sealing resin between a COF tape carrier and a semiconductor element; and moving the plurality of needles along different paths simultaneously while the plurality of needles ejects the sealing resin.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein:

FIGS. 5A–5D illustrate an outline of a first embodiment of the invention;

FIGS. 6A–6G illustrate the flow of the sealing resin under the semiconductor chip during the conventional sealing process in which a conventional COF tape carrier is used;

FIGS. 7A–7G illustrate the flow of a sealing resin under the semiconductor chip during the sealing process according to the first embodiment;

FIGS. 8A–8D illustrate an outline of a second embodiment;

FIGS. 13A–13G illustrate the flow of a sealing resin under the semiconductor chip during the sealing process when the conventional structure of bump is used;

FIGS. 14A–14G illustrate the flow of a sealing resin under the semiconductor chip when the bump according to the fifth embodiment is used;.

FIGS. 21A–21G illustrate the flow of the sealing resin under the semiconductor chip during the sealing process;

DETAILED DESCRIPTION OF THE INVENTION

Prior to the description of the present invention, a COF semiconductor device and a method of manufacturing a COF semiconductor device will be described briefly.

Figure 1A:
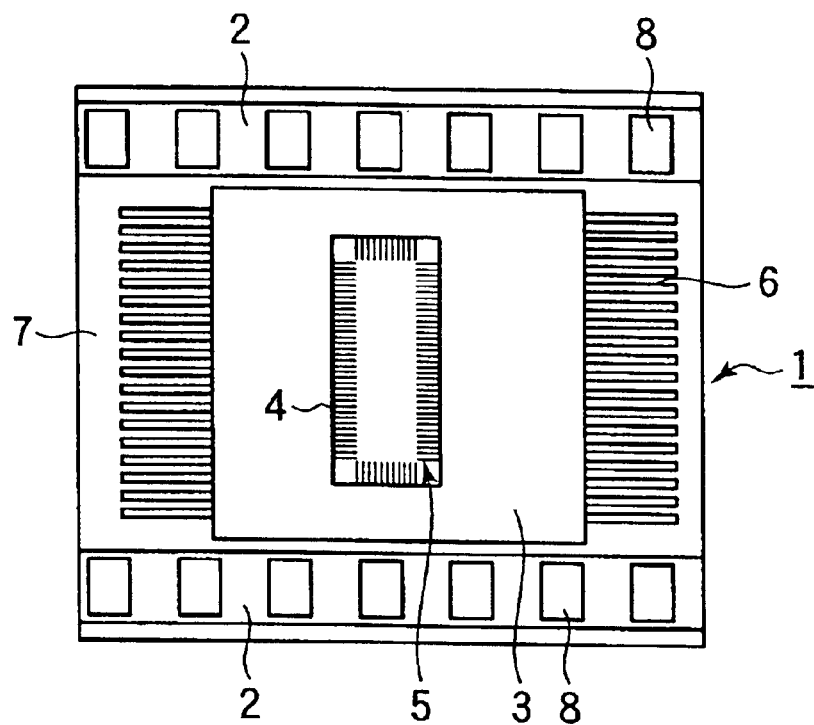
FIGS. 1A and 1B illustrate the general structure of a COF tape carrier according to the present invention.
Figure 1B:
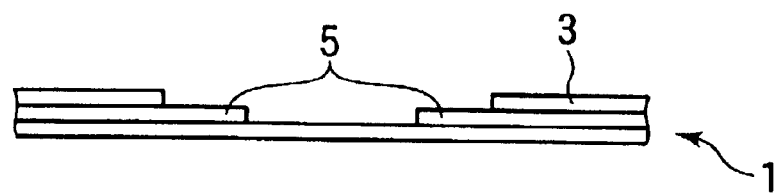

FIGS. 1A and 1B illustrate the general structure of a COF tape carrier according to the present invention. FIG. 1A is a top view and FIG. 1B is an enlarged cross-sectional view of a resist opening formed on the COF tape carrier.

The COF tape carrier in FIG. 1 includes a tape base 1, inner leads 5, input pins 6, and output pins 7, a resist 3, a resist opening 4, and perforations 8. The resist opening 4 is formed in the resist 3 and a semiconductor chip is mounted in alignment with the resist opening 4.

The inner leads 5 in the resist opening 4 are connected to the input pins 6 by metal wires, not shown, provided on the tape base 1. The resist 3 covers the metal wires except for the input pins 6, output pins 7 and inner leads 5, thereby protecting these metal wires from environment. In addition, the metal part 2 embedded in the area of perforations 8 adds mechanical strength to the periphery of the perforations 8, thereby preventing damage to the perforations 8 used for advancing the COF tape carrier.

Figure 2A:
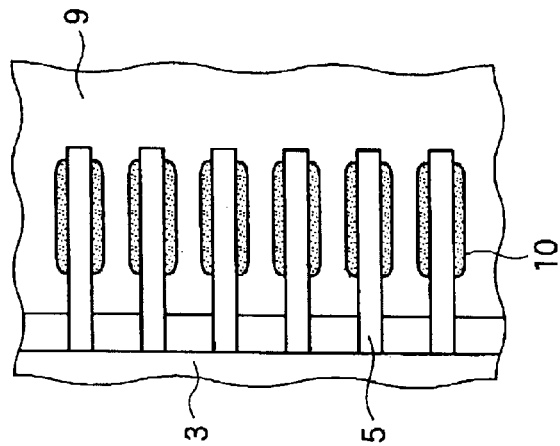
FIGS. 2A–2C illustrate an outline of a COF semiconductor device to which the present invention is applied.
Figure 2B:
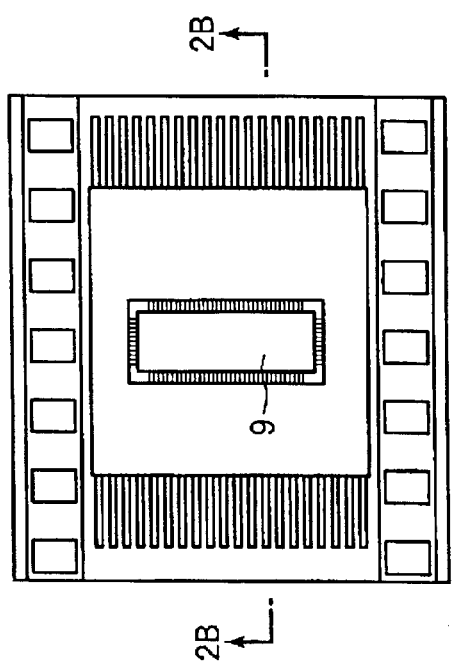
Figure 2C:
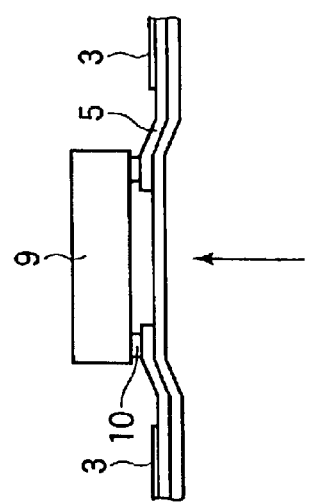

FIGS. 2A–2C illustrate an outline of a COF semiconductor device to which the present invention is applied.

FIG. 2A is a top view.

FIG. 2B is an enlarged cross-sectional view of a bonded portion taken along line 2B—2B when the semiconductor chip is bonded to the COF tape carrier.

FIG. 2C is an enlarged fragmentary view of the bonded structure. A tape base is omitted for purposes of illustration. A tape base is omitted for the purposes of illustration.

FIGS. 2A to 2C illustrate the COF semiconductor device after an inner lead bonding process (referred to as ILB process hereinafter) followed by a resin sealing process (referred to as sealing process hereinafter).

A bump 10 is provided on each of electrode pads of a semiconductor chip 9. During the ILB process, the electrodes of the semiconductor chip 9 are bonded to the corresponding inner leads 5, so that the semiconductor chip 9 is mounted in alignment with the resist opening 4 formed on the COF tape carrier.

Figure 3A:
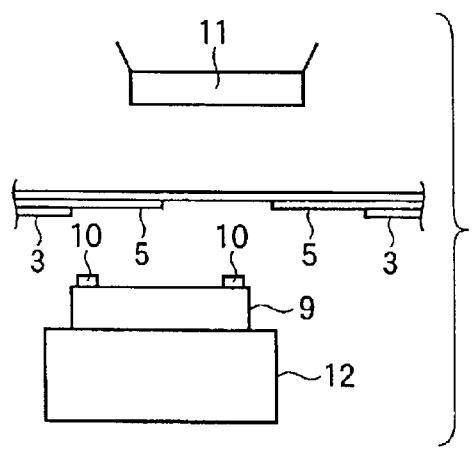
FIGS. 3A–3E are cross-sectional side views, illustrating the outline of the ILB process of a COF semiconductor device.
Figure 3B:
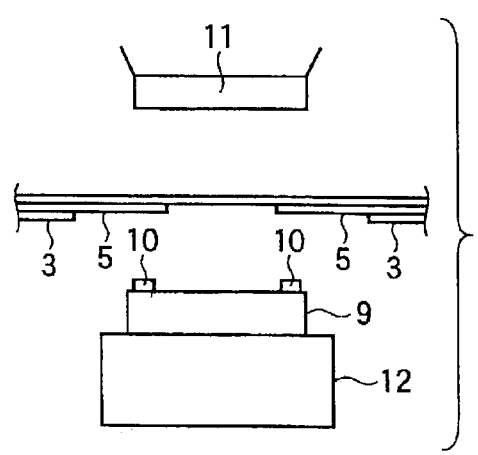
Figure 3C:
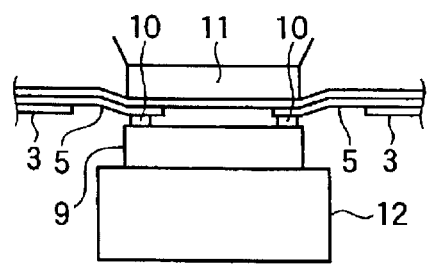

FIGS. 3A–3E are cross-sectional side views, illustrating the outline of the ILB process of a COF semiconductor device. First, a semiconductor chip 9 is placed in position on a bonding stage 12 (FIG. 3A). Then, the bonding stage 12 is positioned so that the electrodes of the semiconductor chip 9 are aligned with the inner leads on the COF tape carrier (FIG. 3B).

The bonding stage 12 is raised while the bonding tool 11 is lowered so that the bonding tool 11 abuts the tape base of the COF tape carrier. The heated bonding tool 11 causes the bumps 10 on the semiconductor chip 9 to melt, thereby bonding the electrodes of the semiconductor chip 9 to the inner leads 5 formed on the COF tape.

Figure 3D:
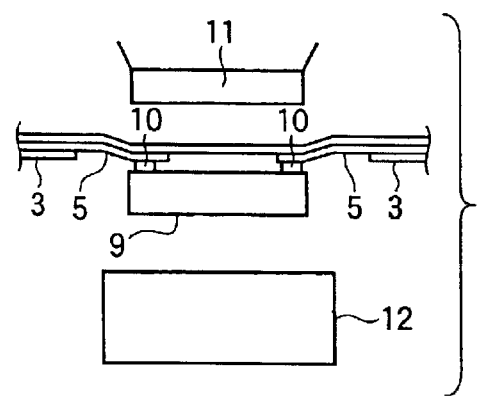

Then, the bonding stage 12 is lowered while the bonding tool 11 is raised, so that the bonding stage 12 is away from the back surface of the semiconductor chip 9 and the bonding tool 11 is away from the tape base of the COF tape carrier (FIG. 3D). This completes the ILB process (FIG. 3E).

Figure 3E:
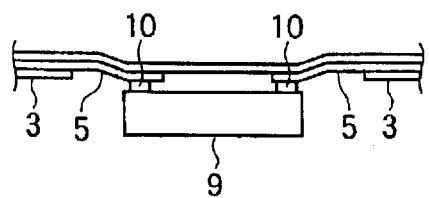

Referring to FIG. 2B and FIG. 3E, the inner leads 5 are somewhat bent downward during the ILB process. The inner leads 5 are so bent to prevent electrical problems that may result from inadvertent contact of the inner leads 5 with the edges of the semiconductor chip 9.

Figure 4A:
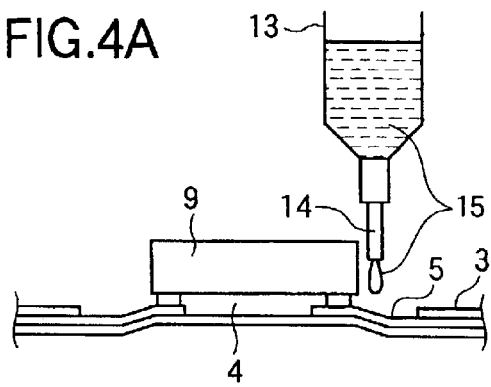
FIGS. 4A–4F illustrate an outline of a sealing process in which a COF semiconductor device according to the present invention is sealed.
Figure 4B:
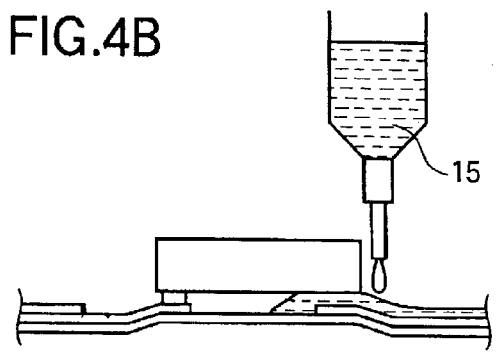
Figure 4C:
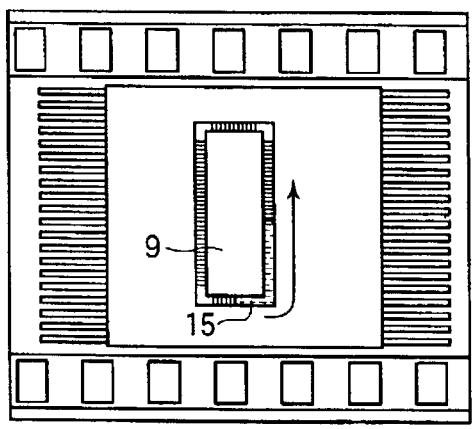
Figure 4D:
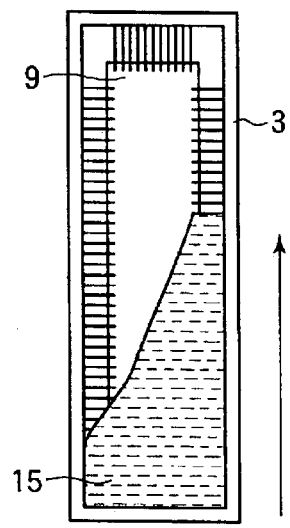
Figure 4E:
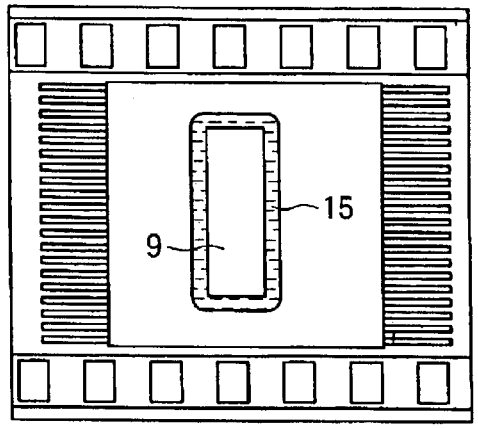
Figure 4F:
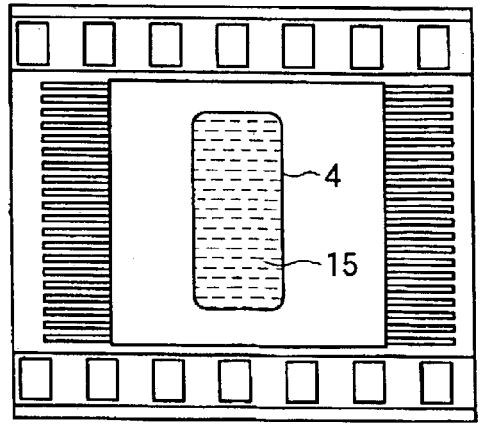

FIGS. 4A–4F illustrate an outline of a sealing process in which a COF semiconductor device according to the present invention is sealed. This sealing process follows the aforementioned ILB process. FIG. 4A is a side view immediately before the sealing process and FIG. 4B is a side view during the sealing process. FIG. 4C is a top view during the sealing process and FIG. 4E is a top view when the sealing is completed. FIG. 4D is a bottom view of a semiconductor chip during the sealing process, illustrating how the sealing resin spreads under the semiconductor chip as the needle is moved in a direction of arrow. FIG. 4F is a top view, illustrating the resist opening or area under the semiconductor chip filled with the sealing resin when the sealing is completed. Arrows in FIGS. 4C and 4D indicate the directions in which the needle moves along the side of the semiconductor chip.

First, a needle 14 mounted on a syringe 13 is positioned in proximity to a side of a semiconductor chip mounted on the COF tape carrier by the ILB process (FIG. 4A).

Then, the syringe 13 begins to eject the sealing resin 15 (FIG. 4B). The needle 14 is moved along the side of the semiconductor chip 9, while ejecting the sealing resin 15.

The needle 14 is usually moved only along each of long sides of the rectangular semiconductor chip 9 in one stroke or along all of the sides of the semiconductor chip 9 in one stroke. Capillary phenomenon allows the sealing resin 15 spreads into the gaps between the bottom surface of the semiconductor chip 9 and the resist opening 4 on the COF tape carrier (FIG. 4B).

Upon completion of the filling of resin, the sealing resin 15 is heated to cure. This completes the sealing process (FIG. 4E).

First Embodiment

FIGS. 5A–5D illustrate an outline of a first embodiment of the invention.

FIG. 5A is a top view of a COF tape carrier before a semiconductor chip is mounted.

FIG. 5B is an enlarged view of a rectangular resist opening 4 in a resist 3 in FIG. 5A.

FIG. 5C is a cross-sectional view of a COF semiconductor device after the ILB process, taken along line 5C—5C of FIG. 5B, after an ILB process.

FIG. 5D is a cross-sectional view taken along 5C—5C of FIG. 5B before the ILB process.

Figure 5E:
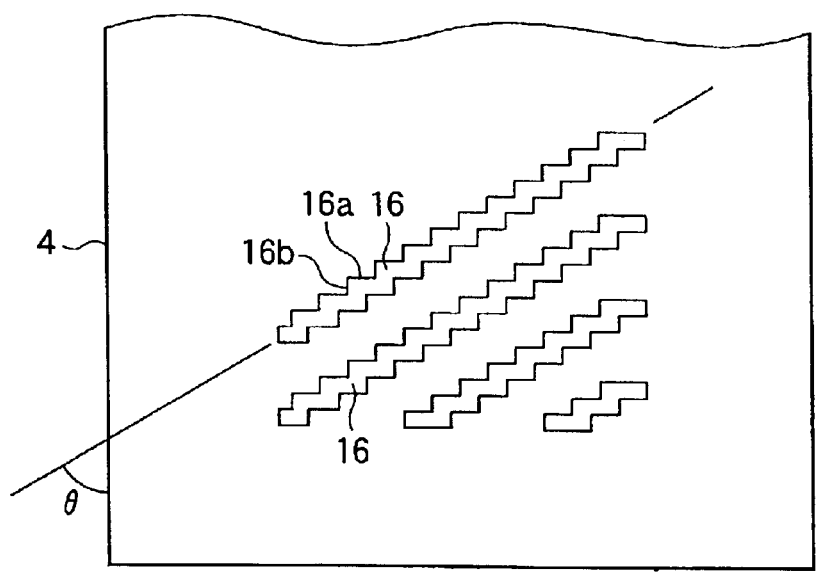
FIG. 5E is a modification of dummy bumps.

FIG. 5E is a modification of dummy bumps.

Elements similar to those in FIG. 2 have been given the same or corresponding references.

The COF tape carrier according to the first embodiment includes a tape base 1, inner leads 5, input pins 6, and output pins 7, a resist 3, a resist opening 4, perforations 8, and dummy wires 16. The resist opening 4 is formed in the resist 3 and a semiconductor chip is mounted on the tape carrier in alignment with the resist opening 4.

The tape base 1 is made of, for example, a polyimide resin. The tape base 1 has a thickness of less than 100 $\mu$m, and preferably 70 $\mu$m or 35 $\mu$m. Because the tape base 1 is very thin, the COF carrier tape has resiliency.

The input pins 6 to the inner leads 5 formed in the resist opening 4 and the output pins 7 are connected through metal wires, not shown, provided on the tape base 1, to the inner leads 5 formed in the resist opening 4. The metal wires are in the form of, for example, copper foil.

The dummy wires 16 are formed on the surface of the tape base 1 within the resist opening 4. The dummy wires 16 are floating wires that do not perform any electrical functions. The dummy wires 16 are in the form of, for example, copper foil.

The inner leads 5 are arranged in inner peripheral areas of the resist opening 4, surrounding the dummy wires 16. The dummy wires 16 extend in directions oblique to the perimeters of the rectangular resist opening 4, creating ridges and valleys that extend in directions oblique to the perimeters of the resist opening 4. The ridges and valleys provide a corrugated surface in the resist opening 4.

Each dummy wire 16 may have segments that are disposed at intervals in the direction oblique to the perimeters of the resist opening 4. If the semiconductor chip has any projections on its underside, the intervals between the segments may be advantageously used to receive projections on the underside of the semiconductor chip.

Further, each of the dummy wires 16 may have side surfaces in the shape of a staircase as shown in FIG. 5E. The side surface has segments 16a that extend in planes substantially perpendicular to the short side of perimeter of the resist opening 4 and segments 16b that extend in planes substantially parallel to the long side of perimeter of the resist opening 4.

During the sealing process, the dummy wires 16 serve to direct the sealing resin to flow in the direction in which the dummy wires 16 extend, thereby preventing air bubbles from occurring. Because the dummy wires 16 are formed in a region surrounded by the inner leads 5, the dummy wires 16 adds some rigidity to the flexible COF tape carrier.

FIGS. 6A–6G illustrate the flow of the sealing resin under the semiconductor chip during the conventional sealing process in which a conventional COF tape carrier is used.

FIGS. 7A–7G illustrate the flow of a sealing resin under the semiconductor chip during the sealing process according to the first embodiment. Referring to FIGS. 6A–6G and 7A–7G, white circles indicate the position of the needle 14 and lines with arrows represent the path of the needle 14 during the sealing process.

As shown in FIGS. 6A–6G, when the conventional COF tape carrier is used, the sealing resin 15 runs too fast, blocking an escape route of the air that exists between the tape base of the COF tape carrier and the bottom surface of the semiconductor chip. This may cause air bubbles to be developed between the COF tape carrier and the semiconductor chip (FIGS. 6F and 6G).

In contrast, when the COF tape carrier according to the first embodiment is used, the dummy wires 16 are electrically floating and guide the sealing resin to flow from the periphery of the semiconductor chip toward the middle of the semiconductor chip 9. This reduces the flow rate of sealing resin 15 along the sides of the semiconductor chip 9, preventing the sealing resin 15 from blocking the escape route of the air that would otherwise causes air bubbles.

Increased rigidity due to the provision of the dummy wires 16 facilitates the sealing process, allowing highly accurate sealing using a resin material.

Second Embodiment

FIGS. 8A–8D illustrate an outline of a second embodiment. FIG. 8A is a top view of a COF tape carrier according to the second embodiment. FIG. 8B is an enlarged view of the resist opening 4 in FIG. 8A. FIG. 8C is a cross-sectional view of the COF semiconductor device according to the second embodiment after an ILB process. FIG. 8D is a cross-sectional view taken along line A—A of FIG. 8B. Elements similar to those in FIGS. 1 and 2 have been given the same or similar references.

Referring to FIGS. 8A, the COF tape carrier according to the second embodiment includes a tape base 1, inner leads 5, input pins 6, and output pins 7, a resist 3, a resist opening 4, and perforations 8. The semiconductor chip 9 is mounted in alignment with the resist opening 4. The tape base 1 has valleys 17 formed therein so that the surface of the tape base 1 has ridges and valleys 17.

The ridges and valleys are formed in an area within the resist opening 4 surrounded by the inner leads 5 in such a way that the ridges and valleys 17 extend in directions oblique to the perimeter of the rectangular resist opening 4.

While the dummy wires 16 according to the first embodiment are in the shape of obliquely extending ridges and valleys, the surface of the tape base 1 may be shaped to have ridges and valleys that extend in directions oblique to the perimeters of the resist opening 4. Thus, the second embodiment provides the same advantages and effects as the first embodiment.

Each dummy wire 16 may have segments that are disposed at intervals in the direction oblique to the perimeters of the resist opening 4. If the semiconductor chip has any projections on its underside, the intervals between the segments may be advantageously used to receive projections on the underside of the semiconductor chip.

Further, each of the dummy wires 16 may have side surfaces in the shape of a staircase as shown in FIG. 5E. The side surface has segments 16a that extend in planes substantially perpendicular to the long side of perimeter of the resist opening 4 and segments 16b that extend in planes substantially parallel to the short side of perimeter of the resist opening 4.

The COF tape carrier according to the second embodiment serves to smoothly guide the flow of the sealing resin so that the air is not trapped in the sealing resin.

Third Embodiment

Figure 9A:
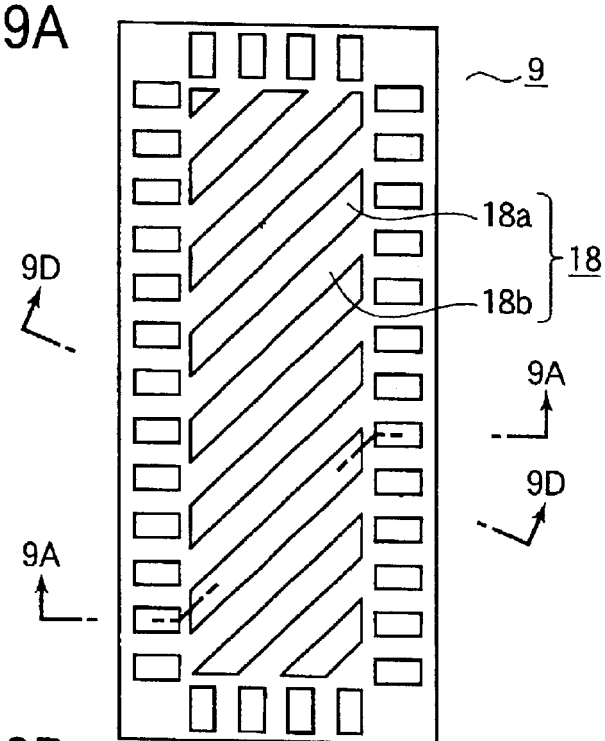
FIGS. 9A–9D illustrate an outline of a third embodiment.
Figure 9B:
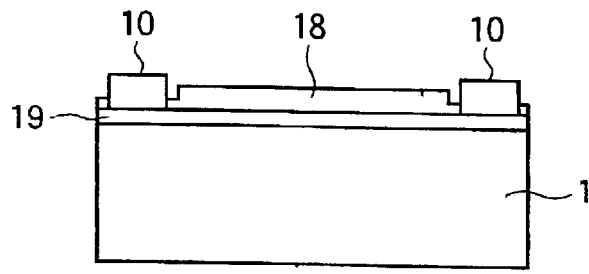
Figure 9C:
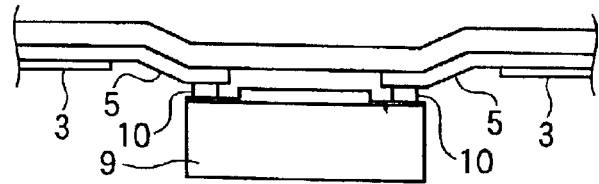
Figure 9D:
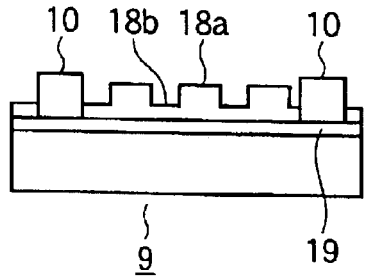

FIGS. 9A–9D illustrate an outline of a third embodiment. FIG. 9A is a top view of a semiconductor chip according to the third embodiment. FIG. 9B is a cross-sectional view taken along line 9B—9B of FIG. 9A. FIG. 9C is a cross-sectional view of a COF semiconductor device according to the third embodiment after an ILB process. FIG. 9D is a cross-sectional view taken along line 9D—9D of FIG. 9A.

The semiconductor chip 9 according to the third embodiment includes bumps 10, a wafer coating (i.e., protection coating) 18 having ridges and valleys in its surface, and wires 19 within the semiconductor chip 9.

The wafer coating 18 is a polymide resin to protect the surface of the semiconductor chip 9 from the environment, and is provided on areas except for the area in which a plurality of electrode pads are formed.

The wafer coating 18 has ridges and valleys formed in its surface so that the ridges and valleys extend in directions oblique to the sides of the rectangular semiconductor chip 9.

The third embodiment is featured by ridges and valleys formed in the surface of the wafer coating 18 formed on the surface of the semiconductor chip 9, as opposed to the first and second embodiments.

Each ridge may have segments that are disposed at intervals in the direction oblique to the sides of the semiconductor chips. If the semiconductor chip has any projections on its underside, the intervals between the segments may be advantageously used to receive projections on the underside of the semiconductor chip.

Further, each of the ridges may have side surfaces in the shape of a staircase similar to that in FIG. 5E. The side surface has segments that extend in planes substantially perpendicular to the short side of perimeter of the resist opening 4 and segments that extend in planes substantially parallel to the short side of perimeter of the resist opening 4.

Fourth Embodiment

FIGS. 10A–10D illustrate an outline of a fourth embodiment.

Figure 10B:
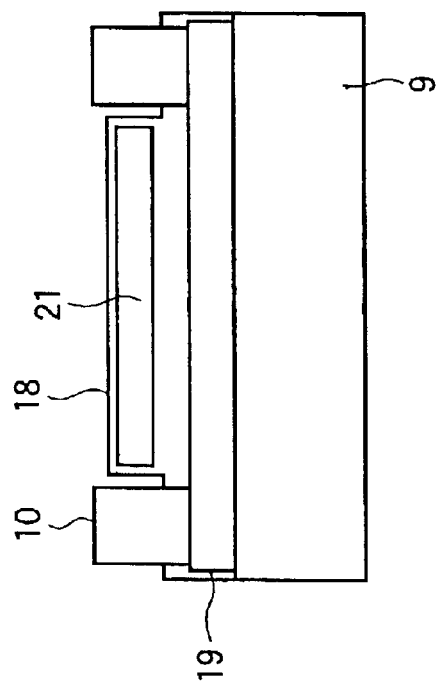
FIGS. 10A–10D illustrate an outline of a fourth embodiment.
Figure 10C:
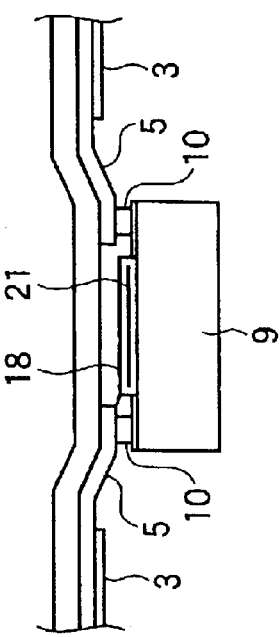
Figure 10A:
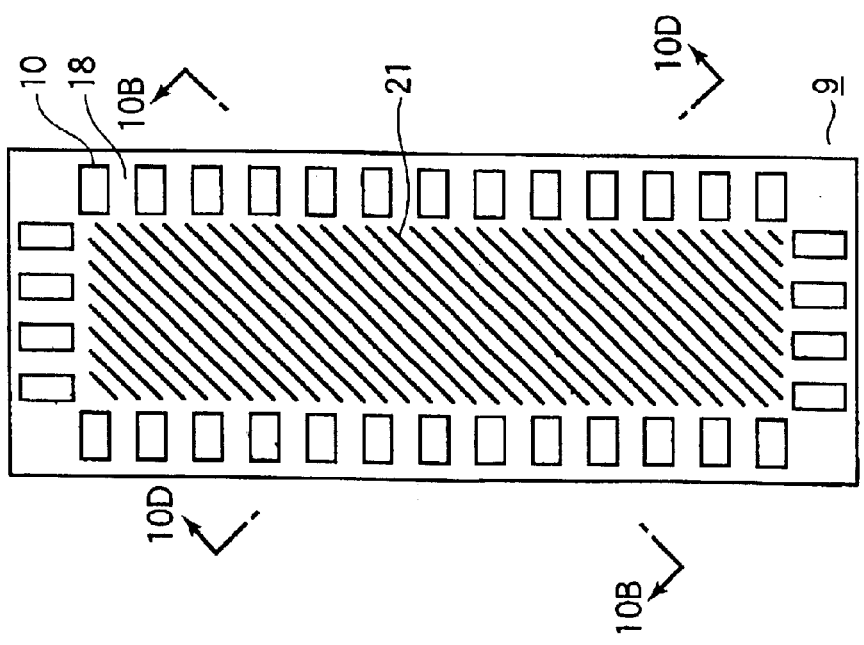

FIG. 10A is a top view of a semiconductor chip according to the fourth embodiment.

FIG. 10B is a cross-sectional view taken along line A—A of FIG. 10A.

FIG. 10C is a cross-sectional view of a COF semiconductor device according to the fourth embodiment after an ILB process.

Figure 10D:
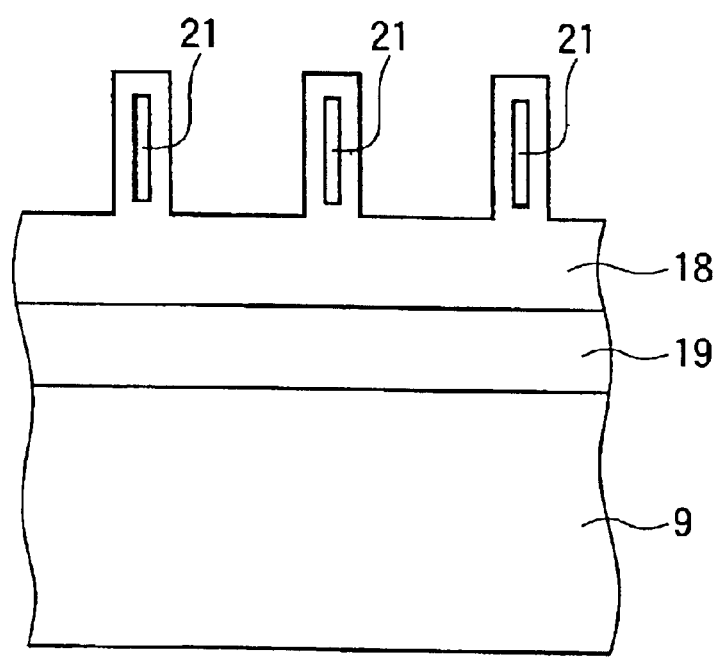

FIG. 10D is a fragmentary cross-sectional view taken along line 10D—10D of FIG. 10A The COF semiconductor device includes bumps 10, a wafer coating 18, wires 19, and dummy wires 21 within the semiconductor chip 9.

The wires 19 connect the electrode pads to, for example, transistors within the semiconductor chip 9. The dummy wires 21 are floating wires that are not connected to any circuits and do not serve any electrical functions. The dummy wires 21 are formed on an upper layer over the wires 19 and in an area surrounded by the bumps 10. The dummy wires 21 extend in directions oblique to the sides of the rectangular semiconductor chip 9.

The obliquely extending dummy wires 21 create ridges and valleys that extend in directions oblique to the sides of the rectangular semiconductor chip 9.

Each dummy wire 21 may have segments that are disposed at intervals in the direction oblique to the sides of the semiconductor chip 9. If the semiconductor chip 9 has any projections on its underside, the intervals between the segments may be advantageously used to receive projections on the underside of the semiconductor chip.

Further, each of the dummy wires 21 may have side surfaces in the shape similar to that shown in FIG. 5E. The side surface has segments that extend in planes substantially perpendicular to the short side of the semiconductor chip 9 and segments that extend in planes substantially parallel to the short side of the semiconductor chip 9.

The fourth embodiment provides the same advantages as the third embodiment and allows formation of finer ridges and valleys than the third embodiment.

Fifth Embodiment

FIGS. 11A–11D illustrate an outline of a fifth embodiment.

Figure 11A:
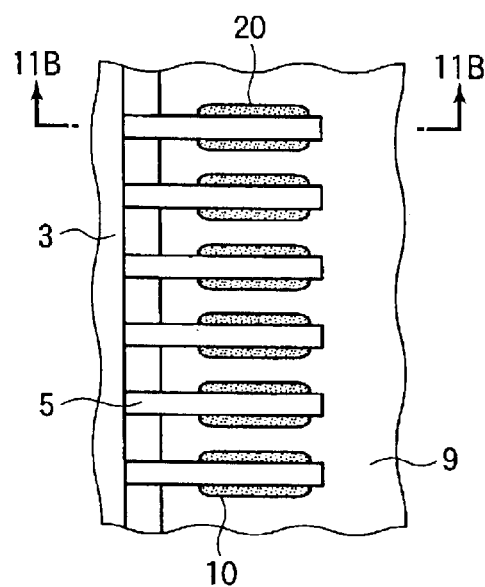
FIGS. 11A–11D illustrate an outline of a fifth embodiment.

FIG. 11A is an enlarged fragmentary view of a bonded portion, showing the relation between the inner leads and the bumps. A tape base is omitted for purposes of illustration.

Figure 11C:
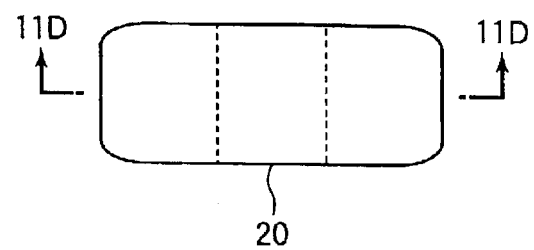
Figure 11B:
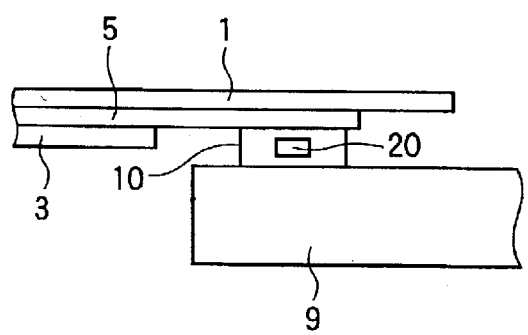

FIG. 11B is a cross-sectional view of FIG. 11A, taken along line 11B—11B.

FIG. 11C is a top view of a bump.

Figure 11D:
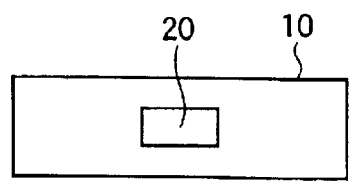

FIG. 11D is a fragmentary cross-sectional view taken along line 11D—11D of FIG. 11C.

Figure 12A:
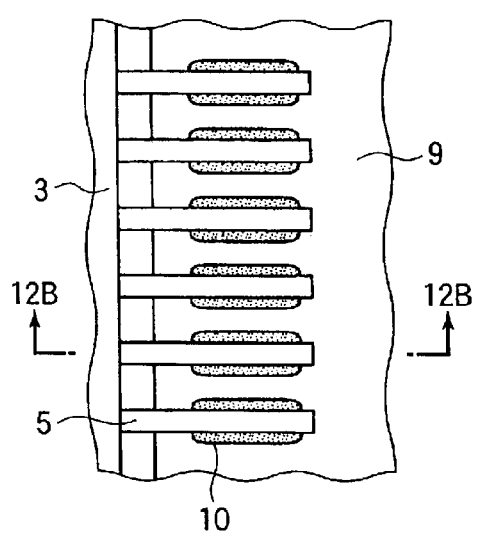
FIGS. 12A–12D illustrate an outline of the conventional art.

FIG. 12A is an enlarged fragmentary view of a bonded portion of a conventional art, showing the relation between the inner leads and the bumps. A tape base is omitted for purposes of illustration.

Figure 12C:
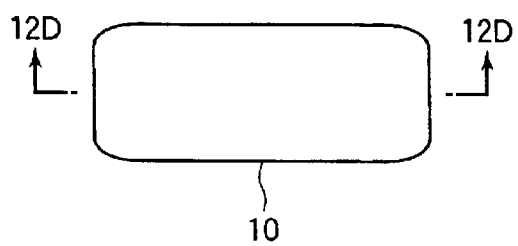
Figure 12B:
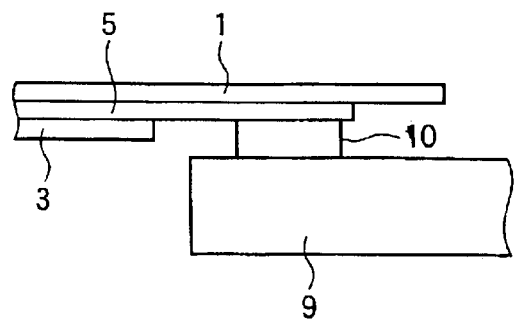

FIG. 12B is a cross-sectional view taken along line 12B—12B of FIG. 12A.

FIG. 12C is a top view of a bump of FIG. 12A.

Figure 12D:

FIG. 12D is a cross-sectional view taken along line 12D—12D of FIG. 12C.

The conventional art semiconductor chip 9 in FIG. 12A has bumps 10 in the shape of a rectangular prism formed on the electrode pads.

In contrast, the semiconductor chip 9 according to the fifth embodiment in FIG. 11 has substantially rectangular bumps 10 each of which has a hole 20 that extends through the bump 10. This hole 20 allows the air to escape from a space on one side of the bump to a space on the other.

FIGS. 13A–13G illustrate the flow of a sealing resin under the semiconductor chip during the sealing process when the conventional structure of bump is used.

FIGS. 14A–14G illustrate the flow of a sealing resin under the semiconductor chip when the bump according to the fifth embodiment is used.

As shown in FIGS. 13A–13G, when the sealing resin flowing away from the middle of the semiconductor chip 9 meets the sealing resin flowing toward the middle of the semiconductor chip at an area between adjacent bumps, the conventional bumps do not provide an escape route for air. These two flows of resin in opposite directions will block the escape route of air (FIG. 13D), causing air bubbles to occur (FIG. 13E). The air bubbles are pushed by the flow of sealing resin toward the middle of the semiconductor chip (FIG. 13F) and then toward the short sides of the rectangular semiconductor chip (FIG. 13G).

As shown in FIGS. 14A–14G, the structure of bumps according to the fifth embodiment provides an escape route of air even when the sealing resin flowing away from the semiconductor chip 9 meets the sealing resin flowing toward the semiconductor chip 9 in an area between adjacent bumps. That is, the air trapped between bumps can escape through the hole 20 (FIG. 14D and 15E). Thus, the hole 20 prevents air bubbles that would otherwise occur due to the air trapped between the bumps (FIG. 14F and FIG. 14G).

Sixth Embodiment

FIGS. 15A–15D illustrate an outline of a sixth embodiment.

Figure 15A:
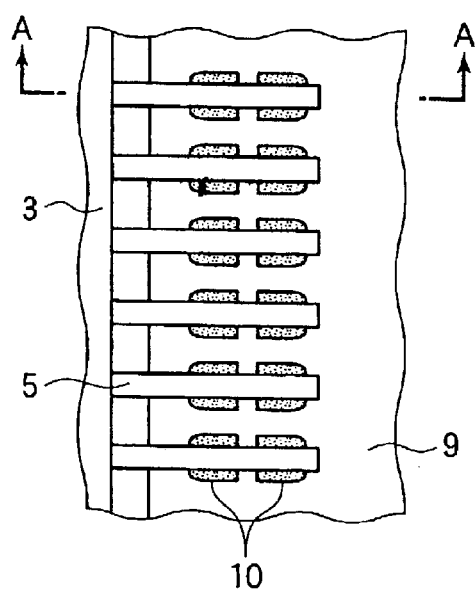
FIGS. 15A–15D illustrate an outline of a sixth embodiment.

FIG. 15A is a fragmentary enlarged view of a bonded portion, illustrating the relation between the inner leads and bumps. A tape base is omitted for the purposes of illustration.

Figure 15C:
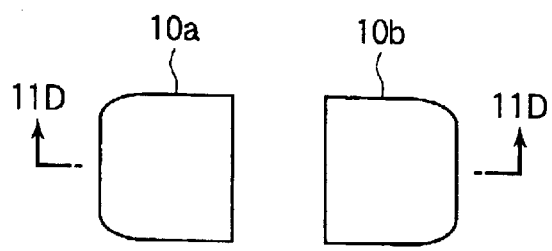
Figure 15B:
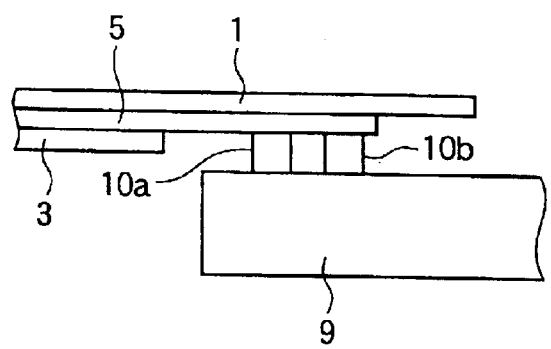

FIG. 15B is a cross-sectional view of FIG. 15A.

FIG. 15C is a top view of a bump.

Figure 15D:
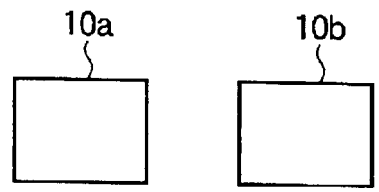

FIG. 15D is a cross-sectional view of a bump.

The conventional semiconductor chip in FIG. 12 has a substantially rectangular bump 10 within an electrode pad of the semiconductor chip and a single bump 10 is bonded to a single carrier lead 5 of the COF tape carrier.

In contrast, the semiconductor chip 9 of the COF semiconductor device according to the sixth embodiment has a bump 10 divided into two segments 10a and 10b as shown in FIGS. 15B and 15C that are positioned within an electrode pad. The segments 10a and 10b are bonded to the inner lead 5 on the COF tape carrier. The air is allowed to pass through the space created between the segments 10a and 10b.

The sixth embodiment allows easier formation of bumps than the fifth embodiment.

Seventh Embodiment

Figure 16A:
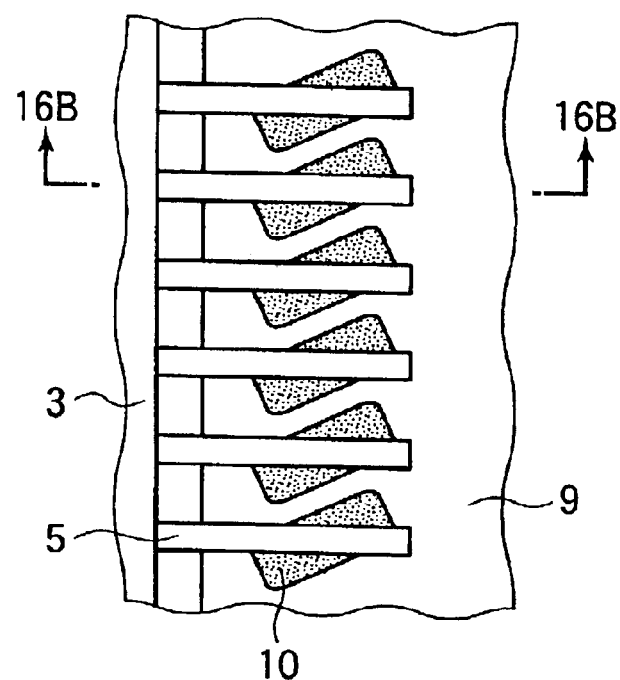
FIGS. 16A and 16B illustrate an outline of a seventh embodiment.
Figure 16B:
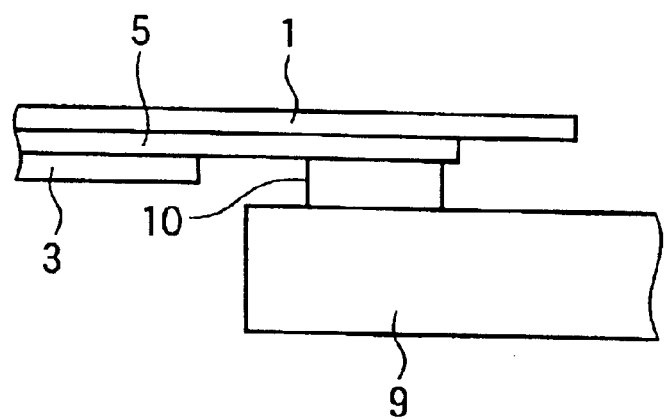

FIGS. 16A and 16B illustrate an outline of a seventh embodiment.

FIG. 16A is a fragmentary enlarged view of a bonded portion, illustrating the relation between the inner leads and bumps. A tape base is omitted for the purposes of illustration.

FIG. 16B is a cross-sectional view of FIG. 16A.

Elements in FIG. 16 have been given the same reference numerals as or similar to those in FIG. 1 or FIG. 2. The conventional semiconductor chip 9 in FIG. 12 has bumps 10 in the shape of a rectangular prism. Each of the bumps 10 extends in a direction substantially perpendicular to a line of electrode pads.

In contrast, the semiconductor chip 9 in FIG. 16 according to the sixth embodiment has substantially rectangular bumps 10. Each of the bumps 10 extends in a, direction oblique to a line of bumps or long sides of the semiconductor chip. During the sealing process, the obliquely oriented bumps 10 guide the sealing resin in such a way that air is not trapped between the bumps 10.

Figure 17D:
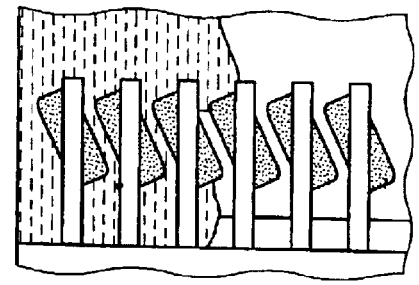
FIGS. 17A–17G illustrate the flow of the sealing resin under the semiconductor chip during the sealing process when the bumps according to the seventh embodiment are used.
Figure 17C:
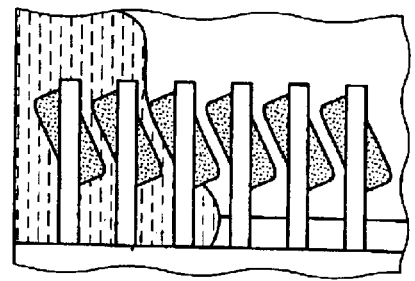
Figure 17G:
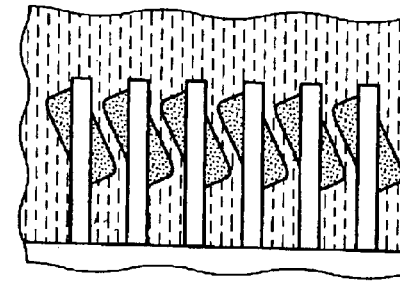
Figure 17B:
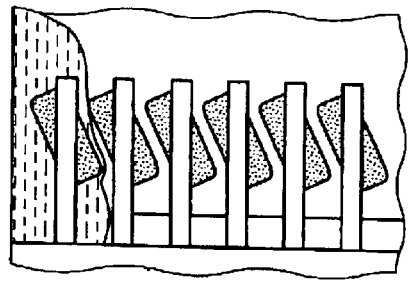
Figure 17F:
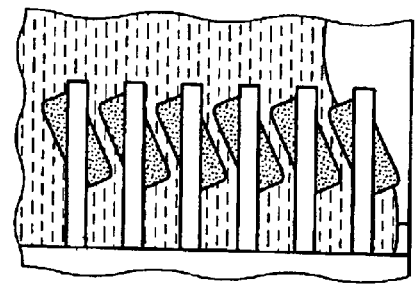
Figure 17A:
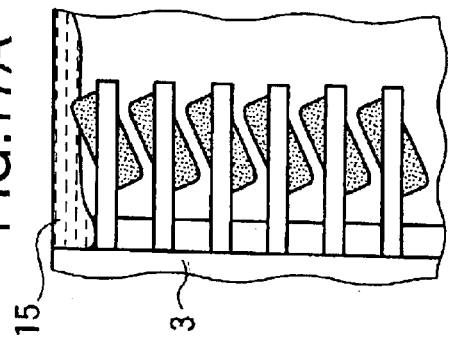
Figure 17E:
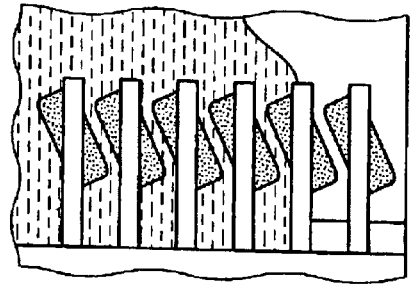

FIGS. 17A–17G illustrate the flow of the sealing resin under the semiconductor chip during the sealing process when the bumps according to the seventh embodiment are used. Referring to FIGS. 17A–17G, each of the bums 10 extends in a direction oblique to a general direction in which the entire flow of the sealing resin moves and guides the flow of the sealing resin into the space between adjacent bumps. It is to be noted that the sealing resin enters earlier into one end of the space than into other end (FIG. 17B). As the overall flow of the sealing resin moves from one of the short sides of the rectangular semiconductor chip 9 to another, the sealing resin that has entered at one end of the space smoothly pushes out the air toward the other end (FIG. 17C).

Even when the sealing resin reaches the both ends of the space defined between the adjacent bumps substantially simultaneously, the air bubbles tend to be pushed in such directions as to move away from the middle of the semiconductor chip 9. This flow mechanism prevents the quality of a COF semiconductor device from being deteriorated, and maintains the good outer appearance of the device.

Eighth Embodiment

Figure 18A:
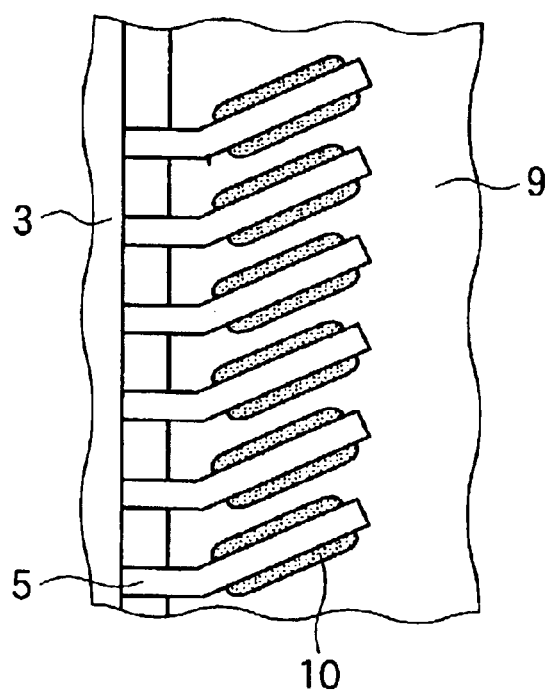
FIGS. 18A and 18B illustrate an outline of an eighth embodiment.
Figure 18B:
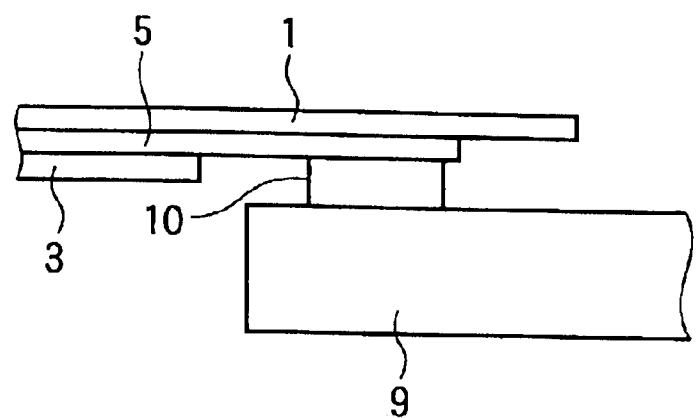

FIGS. 18A and 18B illustrate an outline of an eighth embodiment.

FIG. 18A is a fragmentary enlarged view of a bonded portion, illustrating the relation between the inner leads and bumps. A tape base is omitted for the purposes of illustration.

FIG. 18B is a cross-sectional view of FIG. 18A.

Elements in FIG. 18A and 18B have been given the same as or similar to those in FIG. 1 or FIG. 2. Referring to FIG. 18A, a COF semiconductor device according to the eighth embodiment has substantially rectangular bumps 10 that extend in directions oblique to a line of electrode pads or the perimeter of the resist opening. The obliquely oriented bumps 10 direct the flow of the sealing resin in such a way that the air is not trapped within the sealing resin.

The inner leads 5 of the COF tape carrier are bent at an obtuse angle and the entire leads 5 extend in a plane parallel to a plane in which the bumps 10 lie. In other words, the inner leads 5 extend from the bumps 10 in directions oblique to a line of the bumps 10 or the perimeters of the resist opening 4. One end portion of the inner lead 5 can have a larger area in contact with the bum 10 than the seventh embodiment, ensuring good bonding effect.

Ninth Embodiment

Figure 19A:
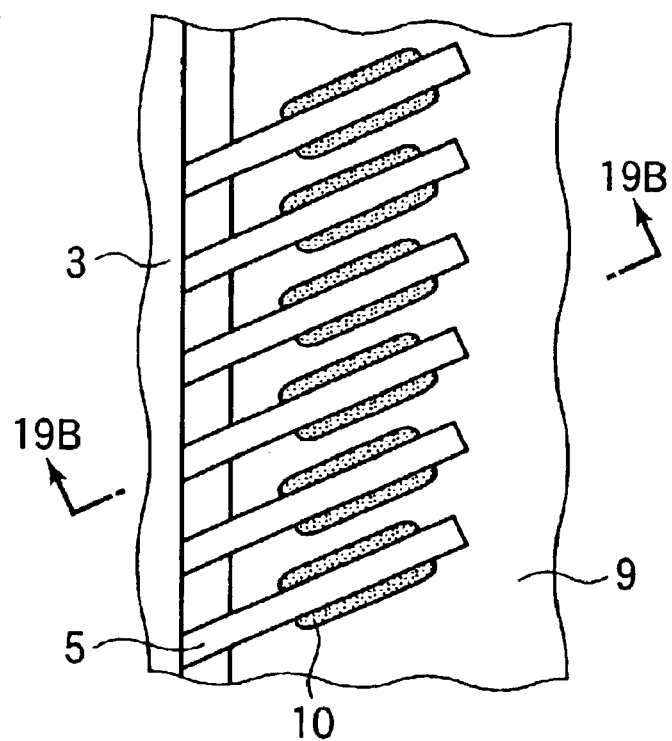
FIGS. 19A and 19B illustrate an outline of a ninth embodiment.
Figure 19B:
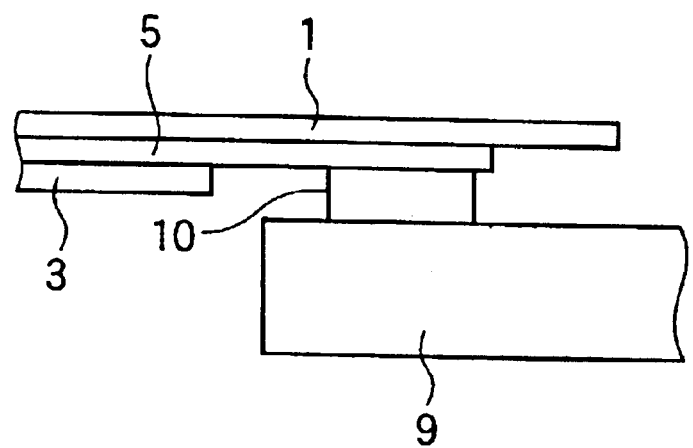

FIGS. 19A and 19B illustrate an outline of a ninth embodiment.

FIG. 19A is a fragmentary enlarged view of a bonded portion, illustrating the relation between the inner leads and bumps. A tape base is omitted for the purposes of illustration.

FIG. 19B is a cross-sectional view of FIG. 19A.

Bumps 10 according to the ninth embodiment are in the shape of a rectangular prism and extend in directions oblique to the perimeters of the resist opening or a direction in which the bumps 10 are aligned. Just as in the seventh and eighth embodiments, the bumps 10 according to the ninth embodiment serve to direct the flow of the sealing resin in such a way that no air bubble is trapped in the sealing resin.

The inner lead 5 extends straight across its entire length in directions oblique to the perimeters of the resist opening 4 or a direction in which the bumps 10 extend. An end portion of the inner lead 5 can have a relatively large area in contact with the bum 10. This relatively large contact area provides good bonding effect. The inner lead 5 extending straight in the directions in which the bumps 10 extend allows the flow of the sealing resin to push air bubbles away from the semiconductor chip smoothly.

The ninth embodiment allows the inner lead 5 to have a larger bonding area than the seventh embodiment, thereby increasing bonding strength. The inner lead 5 extending straight in a direction oblique to the line of bumps 10 or the perimeter of the resist opening 4 ensures smooth flow of the sealing resin in a direction away from the semiconductor chip 9.

Tenth Embodiment

Figure 20A:
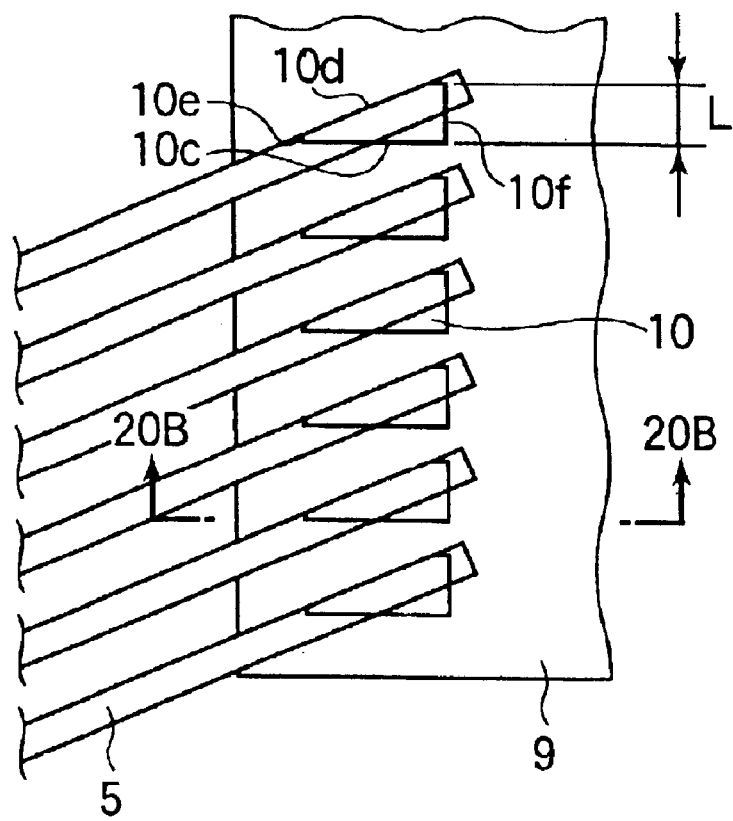
FIGS. 20A and 20B illustrate an outline of a tenth embodiment.
Figure 20B:
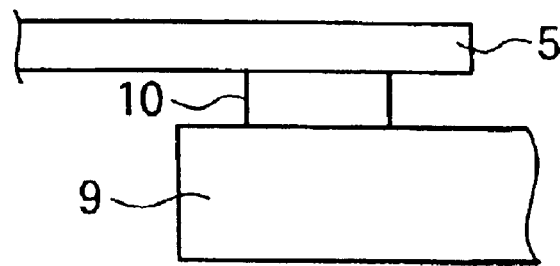

FIGS. 20A and 20B illustrate an outline of a tenth embodiment.

FIG. 20A is a top view of bumps formed on a semiconductor chip. A tape base is omitted for purposes of illustration.

FIG. 20B is a cross-sectional view taken along line A—A of FIG. 20A.

The conventional semiconductor chip 9 in FIG. 12 has bumps 10 in the shape of a rectangular prism. Each of the bumps 10 has two opposing parallel surfaces that lie in planes perpendicular to the line of electrode pads.

Referring to FIG. 20A, the bump 10 has a side surface 10c substantially perpendicular to a direction oblique to the long sides of the semiconductor chip or direction in which the bumps 10 are aligned. The bump 10 has another side surface 10d that extends in a plane oblique to the direction. The side surfaces 10c and 10d define the width of the bump 10 that decreases with increasing distance from the middle of the semiconductor chip 9. The side surface 10c serves to smoothly guide the flow of the sealing resin during the sealing process so that air bubbles will not be trapped in the sealing resin.

FIGS. 21A–21G illustrate the flow of the sealing resin under the semiconductor chip during the sealing process.

Referring to FIGS. 21A–21G, the sealing resin arriving at the side surface 10d is guided to flow along the side surface 10d as the whole sealing resin flows from one of short sides of the semiconductor chip 9 to another.

Because the sealing resin reaching the side surface 10d is guided to flow away from the middle of the semiconductor chip 9, air bubbles are pushed away from the middle of the semiconductor chip 9.

The short sides of the substantially rectangular bump 10 in FIG. 16 are not parallel to a direction in which the sealing resin generally flows from one of two short sides of the rectangular semiconductor chip to the other. Thus, for the sealing process according to the seventh embodiment, the, short sides of the bump 10 are not parallel to the direction in which the sealing resin flows as a whole. The short sides of the bump disturb the flow of the sealing resin, requiring a longer sealing time.

In contrast, the bump 10 according to the tenth embodiment has short sides substantially parallel to the direction in which the sealing resin generally flows from one of the two short sides of the rectangular semiconductor chip 9 to the other. The short sides parallel to the general direction of flow of the sealing resin will not disturb the flow of the sealing resin, saving the time required for sealing process.

The tenth embodiment not only provides the similar advantages to the seventh embodiment but also saves the time required for sealing.

Eleventh Embodiment

Figure 22A:
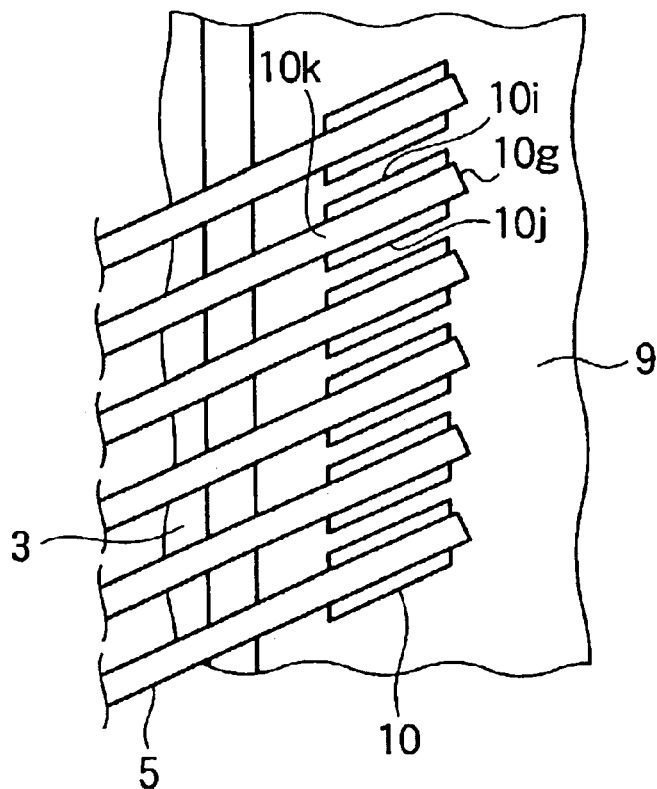
FIGS. 22A and 22B illustrate an outline of an eleventh embodiment.
Figure 22B:
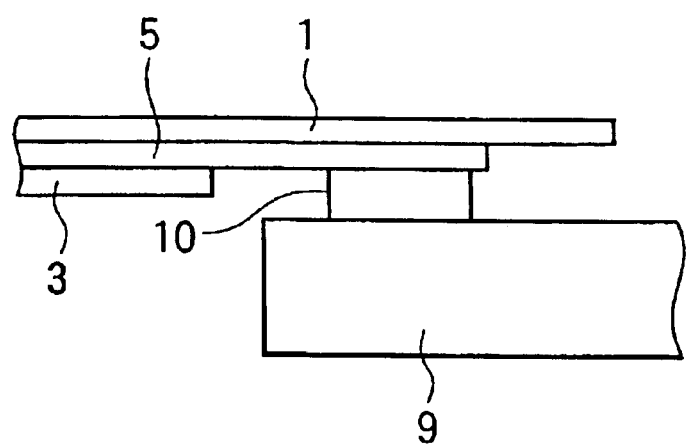

FIGS. 22A and 22B illustrate an outline of an eleventh embodiment.

FIG. 22A is an enlarged view of a bonded structure after the ILB process. A tape base is omitted for the purposes of illustration.

FIG. 22B is a cross-sectional view of FIG. 22A.

The COF semiconductor device in FIGS. 22A and 22B employs a bump 10 in the shape of a hexahedron having opposed parallel surfaces. As shown in FIG. 22A, each of the bumps 10 extends in a direction oblique to a line of bumps 10. The bump 10 has opposed short side surfaces 10c and 10d that extend in directions parallel to the line of bumps 10 and opposed long side surfaces 10e and 10f that extend in directions oblique to the line of electrode pads or the sides of the semiconductor chip 9.

The surface of the bump 10 in contact with the inner lead 5 is in the shape of a parallelogram, and extends longitudinally in a direction oblique to the line of the bumps 10 or the sides of the semiconductor chip. Thus, the obliquely extending surface provides a larger area of the inner lead 5 in contact with the bump than the tenth embodiment, thereby increasing bonding effect.

In the eleventh embodiment, the aforementioned structure allows the sealing resin to flow generally along the surfaces 10i and 10j, the flow of the sealing resin extending in a direction oblique to a line of bumps 10 or the sides of the semiconductor chip, and away from the semiconductor chip.

Twelfth Embodiment

FIGS. 23A–23H illustrate an outline of a twelfth embodiment, showing the flow of the sealing resin under the semiconductor chip during the sealing process.

White circles show the positions of the needles of the syringes while lines with arrows represent the paths of the needles.

As shown in FIGS. 23A–23H, two needles are moved simultaneously to perform the sealing operation.

Figure 23A:
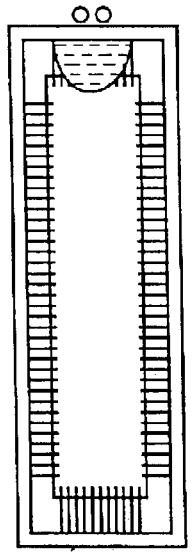
FIGS. 23A–23H illustrate an outline of a twelfth embodiment, showing the flow of the sealing resin under the semiconductor chip during the sealing process.
Figure 23B:
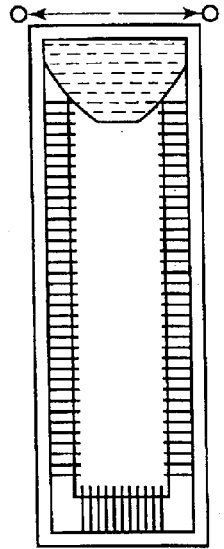
Figure 23C:
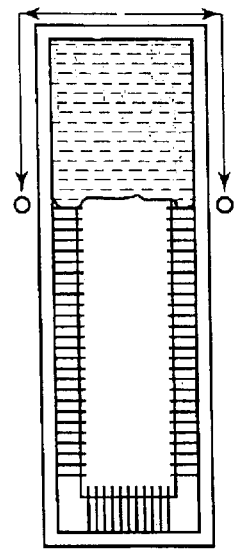
Figure 23D:
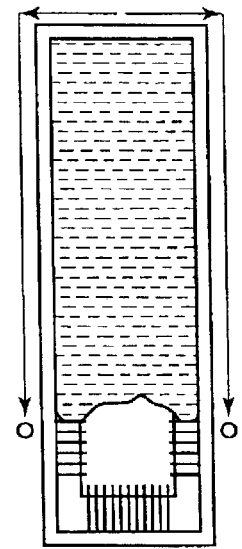
Figure 23E:
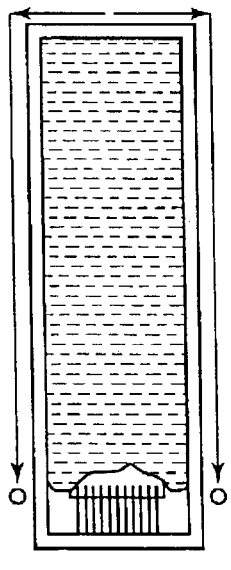
Figure 23F:
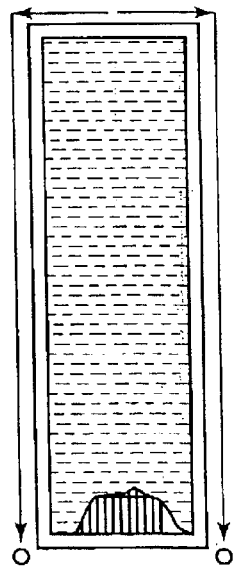
Figure 23G:
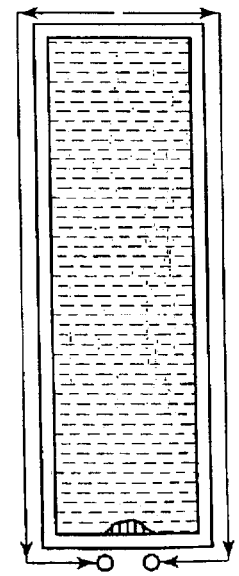
Figure 23H:
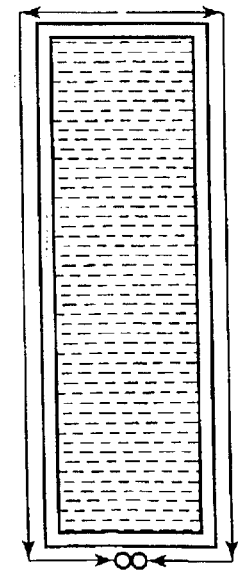

First, two needles are positioned at one of two opposing short sides of a substantially rectangular semiconductor chip 9 (FIG. 23A). Each needle is moved along the short side to the opposing corners of the semiconductor chip 9, while ejecting the sealing resin (FIG. 23B).

As soon as the respective needles reach corresponding corners of the semiconductor chip 9, the needles are turned around the corners and then moved along the long sides of the semiconductor chip 9 toward the corners at the other short side (FIGS. 23A–23F).

Ejecting the sealing resin simultaneously from two needles along two opposing sides does not cause a problem that the sealing resin flows more slowly in some areas than in the other areas. In the twelfth embodiment, the needle can be moved at the same speed that the sealing resin flows so that air bubbles are not trapped in the sealing resin when the sealing resin flows from one of two short sides of the semiconductor chip to the other.

The two needles are preferably moved at the same speed as or lower than the flow of the sealing resin. This speed requirement is effective in ensuring that air is not trapped in the flow of the sealing resin.

This speed is also maintained when the needles travel along not only the long sides of the semiconductor chip but also the short sides.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A COF tape carrier, comprising:
   a resist formed on the COF tape carrier, said resist having portions that define a resist opening within said resist so that a semiconductor element is mounted on the COF tape carrier in alignment with the resist opening; and
   ridges and valleys formed within the resist opening, said ridges and valleys extending in directions oblique to a perimeter of the resist opening.

2. The COF tape carrier according to claim 1, wherein said ridges are formed by dummy metal wires formed on the COF tape carrier, each of the valleys being defined between adjacent ones of the dummy wires.

3. The COF tape carrier according to claim 1, wherein said COF tape carrier has a tape base having a surface formed in the shape of said ridges and valleys.

4. The COF tape carrier according to claim 1, wherein the resist opening has an area in which an inner lead is formed, the area surrounding said ridges and valleys.

5. A COF tape carrier, comprising:
   a resist formed on the COF tape carrier, said resist having portions that define a resist opening within said resist so that a semiconductor element is mounted on the COF tape carrier in alignment with the resist opening;
   ridges and valleys formed within the resist opening, said ridges and valleys extending in directions oblique to a perimeter of the resist opening; and
   an inner lead formed in the resist opening, said inner lead having a first portion that extends in a direction oblique to the perimeter.

6. The COF tape carrier according to claim 5, wherein said inner lead further has a second portion that is continuous to the first portion and extends in a direction substantially perpendicular to the perimeter, the first portion being bonded to the semiconductor element.

7. The COF tape carrier according to claim 5, wherein said inner lead extends straight across its entire length.

8. A semiconductor element mountable on a COF tape carrier, comprising:

a surface having perimeters; and ridges and valleys formed on said surface, each of the ridges and valleys extending in directions oblique to the perimeters.

9. The semiconductor element according to claim 8, wherein said surface has a protection member provided thereon, the protection member being shaped to have said ridges and valleys.

10. The semiconductor element according to claim 8, wherein said surface has dummy wires formed thereon, said dummy wires defining the ridges and valleys.

11. The semiconductors element according to claim 8, wherein the semiconductor element has electrode pads on which bumps are provided, the bumps being closer to the perimeter than the ridges and valleys.

12. The semiconductor element according to claim 8, wherein each of the bumps has two opposed side surfaces that lie in planes substantially perpendicular to a line of the bumps, wherein each of the bumps has a path through which air passes from one of the two opposed side surfaces to the other.

13. The semiconductor element according to claim 8, wherein the path is a through-hole that is formed in each of the bumps and extends from one of the two opposed side surfaces to the other.

14. The semiconductor element according to claim 8, wherein each of the bumps includes two halves that are spaced apart so that a space is defined between the two halves.

15. A semiconductor element mountable on a COF tape carrier, comprising:

a first surface having perimeters and electrode pads formed thereon; and a line of bumps, each of the bumps being formed on the electrode pads, each of the bumps having at least one second surface that opposes an adjacent bump and extends in a plane oblique to the sides.

16. The semiconductor element according to claim 15, wherein the at least one second surface is one of two opposing surfaces.

17. The semiconductor element according to claim 15, wherein the second surface is one of two opposing surfaces of each of the bumps, each of the two opposing surfaces opposing an adjacent bump.

18. The semiconductor element according to claim 15, wherein the each of the bumps has third surfaces that extend in planes substantially parallel to the line of the bumps.

19. A COF tape carrier type semiconductor apparatus having a semiconductor element mounted on a COF tape carrier according to claim 1.

20. A COF tape carrier type semiconductor apparatus having a semiconductor element mounted on a COF tape carrier according to claim 8.

21. A COF tape carrier type semiconductor apparatus having a semiconductor element according claim 15, the semiconductor element being mounted on a COF tape carrier according to claim 5.

* * * * *